(12) United States Patent
Hill

(10) Patent No.: US 7,528,962 B2
(45) Date of Patent: May 5, 2009

(54) APPARATUS AND METHODS FOR REDUCING NON-CYCLIC NON-LINEAR ERRORS IN INTERFEROMETRY

(75) Inventor: Henry A. Hill, Tucson, AZ (US)

(73) Assignee: Zygo Corporation, Middlefield, CT (US)

( * ) Notice: Subject to any disclaimer, the term of this patent is extended or adjusted under 35 U.S.C. 154(b) by 125 days.

(21) Appl. No.: 11/472,668

(22) Filed: Jun. 22, 2006

(65) Prior Publication Data
US 2007/0002330 A1 Jan. 4, 2007

Related U.S. Application Data

(60) Provisional application No. 60/694,872, filed on Jun. 29, 2005.

(51) Int. Cl.
*G01G 11/02* (2006.01)
(52) U.S. Cl. .................. 356/509; 356/500; 356/496
(58) Field of Classification Search ................ 356/500, 356/496, 498, 509
See application file for complete search history.

(56) References Cited

U.S. PATENT DOCUMENTS

| | | |
|---|---|---|
| 4,784,490 A | 11/1988 | Wayne |
| 4,802,765 A | 2/1989 | Young et al. |
| 4,881,815 A | 11/1989 | Sommargren |
| 4,881,816 A | 11/1989 | Zanoni |
| 4,883,357 A | 11/1989 | Zanoni et al. |
| 5,064,289 A | 11/1991 | Bockman |
| 5,200,797 A | 4/1993 | Tank et al. |
| 5,471,304 A | 11/1995 | Wang |
| 5,483,343 A | 1/1996 | Iwamoto et al. |
| 5,675,412 A | 10/1997 | Solomon |
| 5,715,057 A | 2/1998 | Bechstein et al. |

(Continued)

OTHER PUBLICATIONS

International Search Report for International Application No. PCT/US06/24290, filed Jun. 22, 2006.

(Continued)

*Primary Examiner*—Tarifur Chowdhury
*Assistant Examiner*—Michael LaPage
(74) *Attorney, Agent, or Firm*—Fish & Richardson P.C.

(57) ABSTRACT

In general, in one aspect, the invention features interferometry systems that include an interferometer configured to direct a first beam and a second beam derived from common light source along different paths and to combine the two beams to form an output beam including information related to an optical path difference between the different paths, wherein the path of the first beam contacts a measurement object. The interferometry systems also include an afocal system positioned in the path of the first beam and configured to increase a dimension of the first beam as it propagates from the interferometer towards the measurement object and reduces the dimension of the first beam as it returns from the measurement object propagating towards the interferometer.

32 Claims, 6 Drawing Sheets

U.S. PATENT DOCUMENTS

| | | | |
|---|---|---|---|
| 5,757,160 | A | 5/1998 | Kreuzer |
| 5,757,491 | A | 5/1998 | Cai et al. |
| 5,801,832 | A | 9/1998 | Van Den Brink |
| 6,020,964 | A | 2/2000 | Loopstra et al. |
| 6,046,792 | A | 4/2000 | Van Der Werf et al. |
| 6,252,667 | B1 | 6/2001 | Hill et al. |
| 6,271,923 | B1 | 8/2001 | Hill |
| 6,313,918 | B1 | 11/2001 | Hill |
| 6,552,804 | B2 | 4/2003 | Hill |
| 6,762,845 | B2 | 7/2004 | Hill |
| 6,906,784 | B2 | 6/2005 | Hill |
| 2002/0001087 | A1 | 1/2002 | Hill |
| 2003/0053073 | A1* | 3/2003 | Hill ............................ 356/498 |
| 2003/0053079 | A1 | 3/2003 | Hill |
| 2003/0211402 | A1* | 11/2003 | Hill ................................ 430/5 |

OTHER PUBLICATIONS

C Zanoni, "Differential interferometer arrangements for distance and angle measurements: Principles, advantages and applications" *VDI Berichte* Nr. 749, 93-106 (1989).

"Documentation Laser Interferometry in Length Measurement Techniques", Press of the Association of German Engineers, pp. 47-50 (Mar. 12 & 13, 1985), German document with English translation and with Affidavit of Accuracy.

"Documentation Precision of Laser Interferometer Systems", Press of the Association ofGerman Engineers, pp. 97-98 (Apr. 1989), German document with English translation and with Affidavit of Accuracy.

* cited by examiner

APPARATUS AND METHODS FOR REDUCING NON-CYCLIC NON-LINEAR ERRORS IN INTERFEROMETRY

CROSS-REFERENCE TO RELATED APPLICATIONS

This claims priority to Provisional Patent Application No. 60/694,872, entitled "APPARATUS AND METHODS FOR REDUCTION OF NON-CYCLIC NON-LINEAR ERRORS IN INTERFEROMETRY," filed on Jun. 29, 2005, the entire contents of which are incorporated herein by reference.

TECHNICAL FIELD

This invention relates to interferometers and to systems that include interferometers.

BACKGROUND

Displacement measuring interferometers monitor changes in the position of a measurement object relative to a reference object based on an optical interference signal. The interferometer generates the optical interference signal by overlapping and interfering a measurement beam reflected from the measurement object with a reference beam reflected from the reference object.

In many applications, the measurement and reference beams have orthogonal polarizations and different frequencies. The different frequencies can be produced, for example, by laser Zeeman splitting, by acousto-optical modulation, or internal to the laser using birefringent elements or the like. The orthogonal polarizations allow a polarization beam-splitter to direct the measurement and reference beams to the measurement and reference objects, respectively, and combine the reflected measurement and reference beams to form overlapping exit measurement and reference beams. The overlapping exit beams form an output beam that subsequently passes through a polarizer. The polarizer mixes polarizations of the exit measurement and reference beams to form a mixed beam. Components of the exit measurement and reference beams in the mixed beam interfere with one another so that the intensity of the mixed beam varies with the relative phase of the exit measurement and reference beams.

A detector measures the time-dependent intensity of the mixed beam and generates an electrical interference signal proportional to that intensity. Because the measurement and reference beams have different frequencies, the electrical interference signal includes a "heterodyne" signal having a beat frequency equal to the difference between the frequencies of the exit measurement and reference beams. If the lengths of the measurement and reference paths are changing relative to one another, e.g., by translating a stage that includes the measurement object, the measured beat frequency includes a Doppler shift equal to $2vnp/\lambda$, where $v$ is the relative speed of the measurement and reference objects, $\lambda$ is the wavelength of the measurement and reference beams, $n$ is the refractive index of the medium through which the light beams travel, e.g., air or vacuum, and $p$ is the number of passes to the reference and measurement objects. Changes in the phase of the measured interference signal correspond to changes in the relative position of the measurement object, e.g., a change in phase of $2\pi$ corresponds substantially to a distance change $L$ of $\lambda/(2np)$. Distance $2L$ is a round-trip distance change or the change in distance to and from a stage that includes the measurement object. In other words, the phase $\Phi$, ideally, is directly proportional to $L$, and can be expressed as $$\Phi = 2pkL \cos^2\theta \quad (1)$$

for a plane mirror interferometer, e.g., a high stability plane mirror interferometer, where $$k = \frac{2\pi n}{\lambda}$$

and $\theta$ is the orientation of the measurement object with respect to a nominal axis of the interferometer. This axis can be determined from the orientation of the measurement object where $\Phi$ is maximized. Where $\theta$ is small, Equation (1) can be approximated by $$\Phi = 2pkL(1-\theta^2) \quad (2)$$

Unfortunately, this equality is not always exact. Many interferometers include non-linear effects such as those known as "cyclic errors." The cyclic errors can be expressed as contributions to the phase and/or the intensity of the measured interference signal and have a sinusoidal dependence on the change in for example optical path length 2pnL. In particular, a first order cyclic error in phase has for the example a sinusoidal dependence on $(4\pi pnL)/\lambda$ and a second order cyclic error in phase has for the example a sinusoidal dependence on $2(4\pi pnL)/\lambda$. Higher order cyclic errors can also be present as well as sub-harmonic cyclic errors and cyclic errors that have a sinusoidal dependence of other phase parameters of an interferometer system comprising detectors and signal processing electronics. Different techniques for quantifying such cyclic errors are described in commonly owned U.S. Pat. Nos. 6,137,574, 6,252,688, and 6,246,481 by Henry A. Hill.

There are in addition to the cyclic errors, non-cyclic non-linear errors or non-cyclic errors. One example of a source of a non-cyclic error is the diffraction of optical beams in the measurement paths of an interferometer. Non-cyclic error due to diffraction has been determined for example by analysis of the behavior of a system such as found in the work of J.-P. Monchalin, M. J. Kelly, J. E. Thomas, N. A. Kurnit, A. Szöke, F. Zernike, P. H. Lee, and A. Javan, "Accurate Laser Wavelength Measurement With A Precision Two-Beam Scanning Michelson Interferometer," *Applied Optics*, 20(5), 736-757, 1981.

A second source of non-cyclic errors is the effect of "beam shearing" of optical beams across interferometer elements and the lateral shearing of reference and measurement beams one with respect to the other. Beam shears can be caused, for example, by a change in direction of propagation of the input beam to an interferometer or a change in orientation of the object mirror in a double pass plane mirror interferometer such as a differential plane mirror interferometer (DPMI) or a high stability plane mirror interferometer (HSPMI). A change in relative beam shear can also be introduced by a lateral displacement of a measurement object that includes a retroreflector. The relative difference in wavefronts can be a consequence of wavefront errors present in respective components of an input beam to the interferometer, i.e. a common mode type of wavefront error, and/or generated by imperfections in optical components of the interferometer, i.e. a differential mode type of wavefront error.

The non-cyclic non-linearities may also be present in an interferometer as a result of a relative change in the wavefronts of the reference and measurement beam components of an output beam at a detector, i.e. a differential mode type of wavefront error, with or without a change in relative beam shear of the reference and measurement beam components of the output beam at the detector. The differential mode type of wavefront errors can be generated by a change in relative beam shear of reference and measurement beam components at one or more measurement and reference beam path locations in the interferometer although there may be substantially no changes in relative shear between the reference and measurement beam components of the output beam of the interferometer at the detector. In this case, the effects of the change in relative shear of reference and measurement beam components at one or more measurement and/or reference beam path locations generates a differential mode type of change in the wavefronts of the reference and measurement beam components of the output beam irrespective of whether there is a change in relative shear of reference and measurement beam components of the output beam at the detector.

SUMMARY

This invention relates to interferometers, e.g., displacement measuring and dispersion interferometers that measure angular and/or linear displacements of a measurement object such as a mask stage or a wafer stage in a lithography scanner or stepper system.

Beam shearing can be reduced by utilizing an afocal system in an interferometry system. Afocal systems can reduce beam shearing by reducing the size of a beam propagating between a measurement or reference object and an interferometer. The reduction in beam shearing can reduce non-cyclic errors in measurements made using an interferometry systems.

In general, in a first aspect, the invention features interferometry systems that include an interferometer configured to direct a first beam and a second beam derived from common light source along different paths and to combine the two beams to form an output beam having a phase related to an optical path difference between the different paths, wherein the path of the first beam contacts a measurement object, and an assembly positioned in the path of the first beam and configured to reduce a shear of the first beam caused by a variation in the orientation of the measurement object relative to the interferometer as it propagates within the interferometer after contacting the measurement object.

In general, in a second aspect, the invention features interferometry systems that include an interferometer configured to direct a first beam and a second beam derived from common light source along different paths and to combine the two beams to form an output beam having a phase related to an optical path difference between the different paths, wherein the path of the first beam contacts a measurement object, and an afocal system positioned in the path of the first beam between the interferometer and the measurement object and configured to change a diameter of the first beam relative to the first beam's diameter as it exits the interferometer propagating towards the measurement object.

Embodiments of the interferometry systems of the first and second aspects can include one or more of the following features.

The afocal system can change a dimension of the first beam relative to the first beam's dimension as it exits the interferometer. The afocal system can change the diameter of the first beam relative to the first beam's diameter as it exits the interferometer.

The interferometry systems can further include a detector configured to monitor the intensity of a component of the output beam. The interferometry systems can include an electronic controller configured so that during operation of the interferometry system the electronic controller monitors variations in the position of the measurement object relative to the interferometer based on the phase of the output beam. The reduction in shear of the first beam due to the assembly reduces related non-cyclic non-linear errors associated with the phase of the output beam.

The path of the first beam can contact the measurement object more than once. The assembly can be positioned in the path of the first beam for each pass of the first beam to the measurement object.

The interferometer can be a high stability plane mirror interferometer. The measurement object can include a plane mirror or a retroreflector.

In general, in a further aspect, the invention features interferometry systems that include an interferometer configured to direct a first beam and a second beam derived from common light source along different paths and to combine the two beams to form an output beam including information related to an optical path difference between the different paths, wherein the path of the first beam contacts a measurement object. The interferometry systems also include an afocal system positioned in the path of the first beam and configured to increase a dimension of the first beam as it propagates from the interferometer towards the measurement object and reduces the dimension of the first beam as it returns from the measurement object propagating towards the interferometer.

Embodiments of the interferometry systems can include one or more of the following features and/or features of other aspects. For example, the afocal system can reduce a contribution of wavefront errors to the information introduced to the first beam by the interferometer after the first beam contacts the measurement object.

The path of the first beam can contact the measurement object more than once. The interferometry systems can further include a second afocal system positioned in the path of the first beam along which the first beam propagates as it makes a second pass to the measurement object. The second afocal system can be configured to increase the dimension of the first beam as it propagates from the interferometer towards the measurement object for the second time and reduces the dimension of the first beam as it returns from the measurement object propagating towards the interferometer. The afocal systems can reduce the dimension of the first beam by substantially the same amount.

The dimension can be the beam radius along one axis or along two orthogonal axes.

In another aspect, the invention features lithography systems for use in fabricating integrated circuits on a wafer. The lithography systems include a stage for supporting the wafer, an illumination system for imaging spatially patterned radiation onto the wafer, a positioning system for adjusting the position of the stage relative to the imaged radiation, and an interferometry system of the foregoing aspects for monitoring the position of the wafer relative to the imaged radiation.

In a further aspect, the invention features lithography systems for use in fabricating integrated circuits on a wafer. The lithography systems include a stage for supporting the wafer, and an illumination system including a radiation source, a mask, a positioning system, a lens assembly, and an interferometry system of the foregoing aspects, wherein during operation the source directs radiation through the mask to produce spatially patterned radiation, the positioning system adjusts the position of the mask relative to the radiation from the source, the lens assembly images the spatially patterned radiation onto the wafer, and the interferometry system monitors the position of the mask relative to the radiation from the source.

In another aspect, the invention features beam writing systems for use in fabricating a lithography mask. The beam writing systems include a source providing a write beam to pattern a substrate, a stage supporting the substrate, a beam directing assembly for delivering the write beam to the substrate, a positioning system for positioning the stage and beam directing assembly relative one another, and an interferometry system of the foregoing aspects for monitoring the position of the stage relative to the beam directing assembly.

In a further aspect, the invention features lithography methods for use in fabricating integrated circuits on a wafer, the methods including supporting the wafer on a moveable stage, imaging spatially patterned radiation onto the wafer, adjusting the position of the stage, and monitoring the position of the stage using an interferometry system of the foregoing aspects.

In yet another aspect, the invention features lithography methods for use in the fabrication of integrated circuits. The methods include directing input radiation through a mask to produce spatially patterned radiation, positioning the mask relative to the input radiation, monitoring the position of the mask relative to the input radiation using the interferometry system of the foregoing aspects, and imaging the spatially patterned radiation onto a wafer.

In a further aspect, the invention features lithography methods for fabricating integrated circuits on a wafer that include positioning a first component of a lithography system relative to a second component of a lithography system to expose the wafer to spatially patterned radiation, and monitoring the position of the first component relative to the second component using an interferometry system of the foregoing aspects.

In another aspect, the invention features methods for fabricating integrated circuits using a lithography method and/or lithography system of the foregoing aspects.

In a further aspect, the invention features methods for fabricating a lithography mask that include directing a write beam to a substrate to pattern the substrate, positioning the substrate relative to the write beam, and monitoring the position of the substrate relative to the write beam using an interferometry system of the foregoing aspects.

Among other advantages, embodiments of the present invention can reduce the magnitude of beam shear between the reference and measurement beams of an interferometer relative to the size of the reference and measurement beams. As a result, there can be a reduction of the magnitude of non-cyclic non-linear errors in measured phases of electrical interference signals due to wavefront errors and relative beam shears and due to differential wavefront errors that are a consequence of beam shears.

Another advantage is that the reduction of the magnitude of non-cyclic non-linear errors in measured phases of electrical interference signals is achieved passively. In other words, the error reduction comes about due to the inclusion of passive optical components, rather than active components, such as servo-controlled mirrors.

A further advantage is that the magnitude of non-cyclic non-linear errors in measured phases of electrical interference signals due to birefringence in optical elements of an interferometer can be reduced.

Another advantage is that the size of an interferometer can be reduced without enhancing the size of non-cyclic non-linear errors. This advantage is a result of, for example, using a beam-expanding afocal system to increase the beam diameter of an interferometer measurement beam along the interferometer's measurement path. The beam afocal system is configured to return the beam to its original dimension before the reflected measurement beam re-enters the interferometer. Accordingly, a beam having a desired size can be presented by the interferometry system to the measurement object, while the beam size is reduced within the interferometer itself.

Another advantage is that the thermal time constant of an interferometer can be reduced without enhancing the size of non-cyclic non-linear errors.

Another advantage of the present invention is that the sensitivity of an interferometer to effects of thermal gradients can be reduced without enhancing the size of non-cyclic non-linear errors.

The details of one or more embodiments of the invention are set forth in the accompanying drawings and the description below. Other features, objects, and advantages of the invention will be apparent from the description and drawings, and from the claims.

DESCRIPTION OF DRAWINGS

FIG. 2(*b*) is a diagrammatic elevational view of an afocal system comprising a prismatic anamorphic afocal attachment.

FIG. 2(*c*) is a diagrammatic elevational view of an afocal system comprising a birefringent anamorphic afocal attachment.

Like reference symbols in the various drawings indicate like elements.

DETAILED DESCRIPTION

Figure 1:
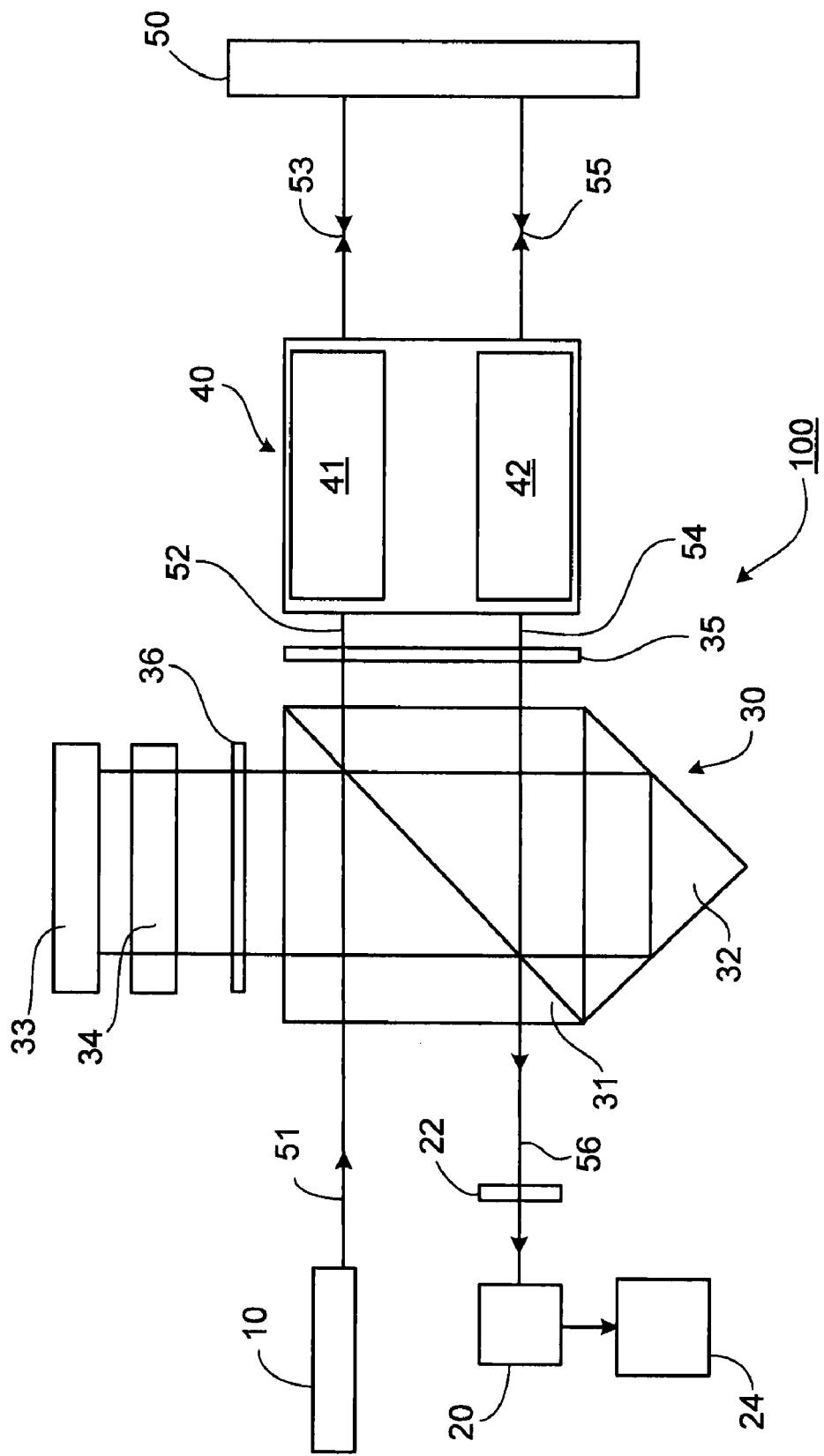
FIG. 1 is a diagrammatic view of a high stability plane mirror interferometer with an afocal system in the measurement beam path.

Referring to FIG. 1, an interferometry system 100 includes a double-pass plane mirror interferometer generally indicated at numeral 30, a light source 10, a plane mirror measurement object 50, a detector 20, an electronic processor 24, and an afocal system 40. interferometry system 100 also includes an analyzer 22 positioned between interferometer 30 and detector 20.

Interferometer 30 shown in FIG. 1 is a high stability plane mirror interferometer (HSPMI) and includes a polarizing beam splitter 31, a retroreflector 32, a reference mirror 33, and quarter wave plates 35 and 36. Optionally, interferometer 30 includes a spacer 34 (e.g., a glass spacer) to reduce the optical path length difference between the path of the reference and measurement beams in glass due to afocal system 40.

During operation of interferometry system 100, light source 10 directs an input beam along a path 51 towards interferometer 30. Polarizing beam splitter 31 splits the input beam into a measurement beam and a reference beam. The measurement and reference beams are polarized orthogonally with respect to each other. The reference beam passes to reference mirror 33, reflects from retroreflector 32, and returns to reference mirror 33. After reflecting from reference mirror 33 a second time, polarizing beam splitter 31 directs the reference beam towards analyzer 22 and detector 20 along output beam path 56.

The measurement beam exits interferometer along path 52, traverses afocal system 40, and continues toward measurement object along path 53. Upon reflection from measurement object 50, the first pass beam returns to interferometer 30 along paths 52 and 53. Polarizing beam splitter directs the measurement beam to reflect from retroreflector 32 and then back towards measurement object 50 along path 54. On its second pass to the measurement object, the measurement beam again traverses afocal system 40, exiting the afocal system along path 55. The second pass measurement beam reflects from measurement object 50 and returns to interferometer 30 along paths 55 and 54, again traversing afocal system 40. After the second pass, the measurement beam exits interferometer 30 along output beam path 56. The measurement beam and reference beam propagating along output beam path 56 are collectively referred to as the output beam.

Afocal system 40 includes two afocal attachments, namely afocal attachment 41 and afocal attachment 42. Afocal attachment 41 is positioned in the path of the first pass measurement beam while afocal attachment 42 is positioned in the path of the second pass measurement beam.

Afocal attachment 41 expands the diameter of the first pass measurement beam as it travels from interferometer 30 to measurement object 50. Conversely, afocal attachment reduces the diameter of the reflected first pass measurement beam as it returns from measurement object 50 to interferometer 30. Thus, the diameter of the first pass measurement beam is larger as it propagates along path 53 compared to its diameter along path 52.

Similarly, afocal attachment 42 expands the diameter of the second pass measurement beam as it travels from interferometer 30 to measurement object 50 and reduces the size of the reflected second pass measurement beam as it returns from measurement object 50 to interferometer 30.

When measurement object 50 is nominally orthogonal to measurement beam paths 53 and 55, the measurement and reference beam components of the output beam are coextensive beam components with a propagation direction parallel to the propagation direction of the input beam. The measurement beam component of the output beam is laterally sheared as the measurement object plane mirror 50 is tilted. For a magnification $\eta$ by the afocal system 40 for beams propagating towards measurement object 50, the magnitude of the shear is $(4\alpha L_M)/\eta$ for a rotation of the measurement object mirror 50 by an angle $\alpha$ where $L_M$ is the one-way physical length of the measurement beam path.

In general, rotation of measurement object 50 includes rotations about two orthogonal axes for the object plane mirror. The corresponding beam shear at the first pass measurement beam in the interferometer after afocal system 40 is $(2\alpha L_M)/\eta$. In other words, afocal attachment 41 reduces beam shear of the first pass measurement beam exiting afocal attachment 41 along path 52 relative to the beam shear of the beam as it enters the afocal attachment along path 53.

Thus a reduction by a factor of $\eta$ can be obtained for the magnitudes of the beam shear relative to the beam diameter. This reduction in beam shear can result in a corresponding reduction in the non-cyclic non-linear errors. The reduction in the size of the measurement beam does not necessarily reduce the effect of wavefront errors introduced into the beam prior to the beam re-entering the interferometer after its first pass to the measurement object. However, due to the reduced beam size, the scale of wavefront errors introduced into the measurement beam while it propagates through the interferometer components between its first and second pass to the measurement object are reduced. To the extent that the wavefront errors introduced to the beam scale linearly with the beam size, their effect on associated non-cyclic non-linear errors are not necessarily reduced. However, where the wavefront errors scale non-linearly with beam size, their effects on associated non-cyclic non-linear errors can be reduced. These effects are illustrated by example below.

Similar results may be obtained for inserting an afocal system in the reference beam path. Accordingly, in certain embodiments, an afocal system can be positioned in the path of the reference beam.

The effect of the beam shear and common mode and differential mode types of wavefront errors will depend upon procedures used to mix components of the output beam with respect to component polarization states and procedures used to detect the mixed output beam to generate an electrical interference signal. The mixed output beam may for example be detected by a detector without any focusing of the mixed beam onto the detector, by detecting the mixed output beam as a beam focused onto a detector, or by launching the mixed output beam into a single mode or multi-mode optical fiber and detecting a portion of the mixed output beam that is transmitted by the optical fiber. The effect of the beam shear and common mode and differential mode types of wavefront errors will also depend on properties of a beam stop should a beam stop be used in the procedure to detect the mixed output beam.

Another mechanism that generates non-cyclic non-linearities in an interferometer of the differential mode type is relative changes in the temperature of the optical paths of the reference and measurement beams in the interferometer.

Consider examples of the differential mode type of wavefront error wherein a first and a second beam components of a mixed output beam have Gaussian intensity distributions and wavefront error functions $\Delta\phi_1$ and $\Delta\phi_2$, respectively. The wavefront error functions $\Delta\phi_1$ and $\Delta\phi_2$ have for the differential mode type examples the same functional form and opposite signs. Wavefront error functions $\Delta\phi_1$ and $\Delta\phi_2$ can be expressed as $$\Delta\phi_m = (-1)^m k(\varepsilon_j \lambda)\left(\frac{r}{w}\right)^j, \quad m=1, 2, \quad j=1, 2 \ldots, \quad (3)$$

where w is the radius at which the amplitude of the output beam is reduced by a factor 1/e, e the base of the natural logarithm, $\lambda$ is the wavelength of the beam component, k is the wavenumber $k=2\pi/\lambda$, and $\varepsilon_j$ is a dimensionless parameter characterizing the size of the wavefront error. For values of $\varepsilon_j$ corresponding to a Root Mean Square wavefront error of $\lambda/20$ for a Gaussian beam of radius w, $\lambda=633$ nm, a double pass interferometer, a relative beam shear of magnitude b, and the mixed beam being detected without any stops at the detector, there will be an error $\Delta\Phi_j$ in the measured phase of the electrical interference signal and an error $\xi_j$ in the relative location of the measurement object. Values of $\Delta\Phi_j$ and $\xi_j$ are listed in Table 1 for the example of 2w=6 mm and b=1.5 mm. Also listed in Table 1 is the error $\xi_j/\eta^j$ for an example of $\eta=4$.

TABLE 1

| Wavefront Error | j | $\Delta\Phi_j$ radians | $\xi_j$ nm | $\xi_j/\eta^j$ nm |
|---|---|---|---|---|
| Linear | 1 | 0.31 | 7.9 | 1.98 |
| Quadratic | 2 | 0.11 | 2.8 | 0.18 |
| Cubic | 3 | 0.24 | 6.1 | 0.095 |
| Quartic | 4 | 0.10 | 2.4 | 0.0094 |
| Quintic | 5 | 0.40 | 10.0 | 0.0024 |

The error in measured displacement can be quite different from that given in Table 1 if, for example, the mixed output beam is focused onto a detector or launched into a multi-mode fiber optic and then detected.

Examples of the effect of reducing the size of a beam in the present invention by a factor of $\eta=4$ are listed in the fifth column of Table 1 as a function of j. The examples in the fifth column of Table 1 are of the differential mode type.

In an interferometer system that includes an afocal system, there may be a reduction of the magnitude of non-cyclic non-linear errors by an order of magnitude or more due to changes in relative beam shears and wavefront errors introduced by an interferometer.

The afocal systems may introduce wavefront errors as a result of imperfections in the manufacture of the afocal systems. However, at each surface/interface and associated optical medium of an afocal system wherein the size of a beam is reduced for a given direction of beam propagation through the afocal system, the wavefront errors introduced by the surface/interface and associated medium are accordingly reduced. The effectiveness of the reduction for a given degree of wavefront error increases as the degree of the wavefront error increases. Thus the effective number of surfaces and associated optical path lengths of the afocal system in terms of generation of wavefront errors is of the order of 2. This is to be compared, for example, to an effective number of surfaces/interfaces and associated optical path lengths for a double pass plane mirror interferometer of 17.

A consequence of the reduction of the size of reference and/or measurement beams is that the size of the interferometer can be reduced without enhancing the size of non-cyclic non-linear errors associated with changes in beam shear. A reduction in the size of the interferometer can also reduce the combined effect of beam shear and birefringence in components of the interferometer in the production of non-cyclic non-linear errors. The reduction of the size of the interferometer further has the consequence that the thermal time constant of an interferometer can be reduced without enhancing the size of non-cyclic non-linear errors. An additional consequence of the reduction of the size of the interferometer is that the sensitivity of an interferometer to effects of thermal gradients can be reduced without enhancing the size of non-cyclic non-linear errors.

Figure 2A:
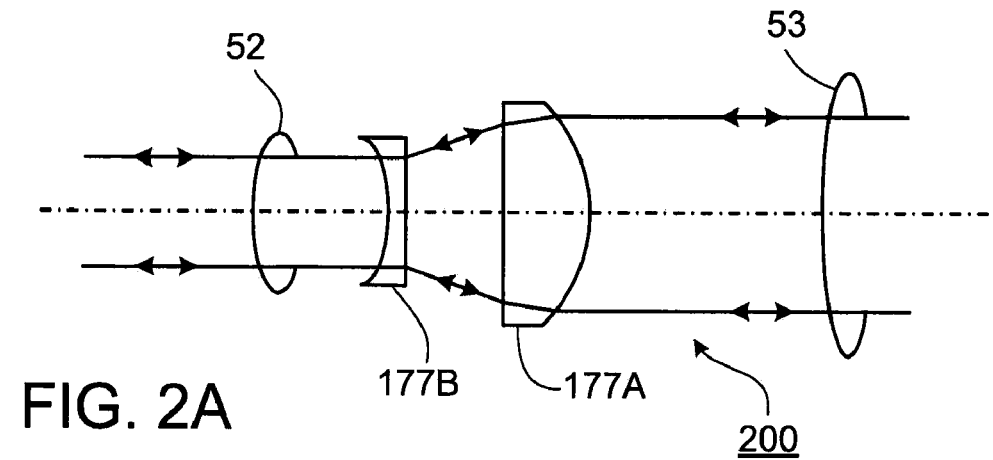
FIG. 2(*a*) is a diagrammatic elevational view of an afocal system comprising a Galilean afocal lens.

The form of afocal attachments 41 and 42 can vary. In general, afocal attachments can include afocal lenses and/or anamorphic afocal attachments (see, e.g., Chapter 2 entitled "Afocal Systems" by W. B. Wetherell in *Handbook Of Optics II*, Second Edition (McGraw-Hill)). An embodiment of an afocal system is shown diagrammatically in FIG. 2a. Afocal system 200 shown in FIG. 2a is known as a Galilean afocal lens. Galilean afocal lens 200 includes positive and negative lenses 177A and 177B, respectively. Alternatively, a Keplerian afocal lens can be used. If a Keplerian afocal lens is used, the inverting features of the Keplerian afocal lens will change the sign of the sensitivity.

Figure 2B:
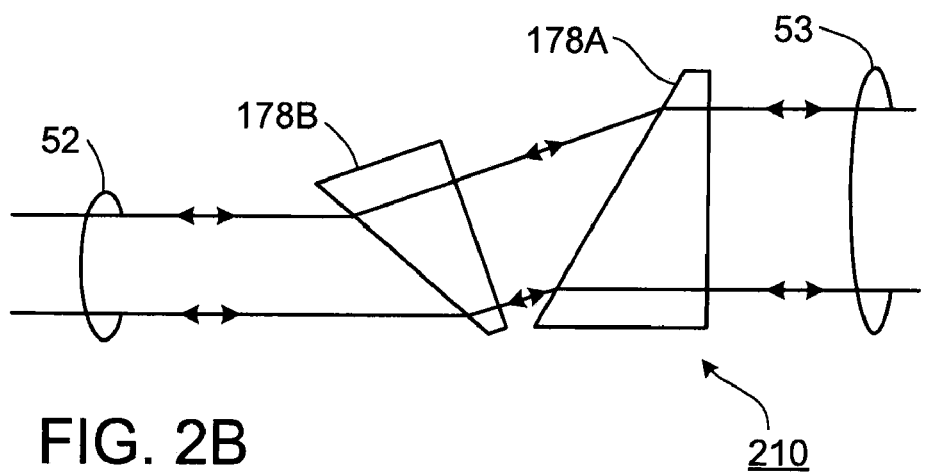

Anamorphic afocal attachments may be based on cylindrical lenses, prisms, and/or birefringent elements. An example of a prismatic anamorphic afocal attachment is shown diagrammatically in FIG. 2b. Prismatic anamorphic afocal attachment 210 shown includes two prisms 178A and 178B.

Figure 2C:
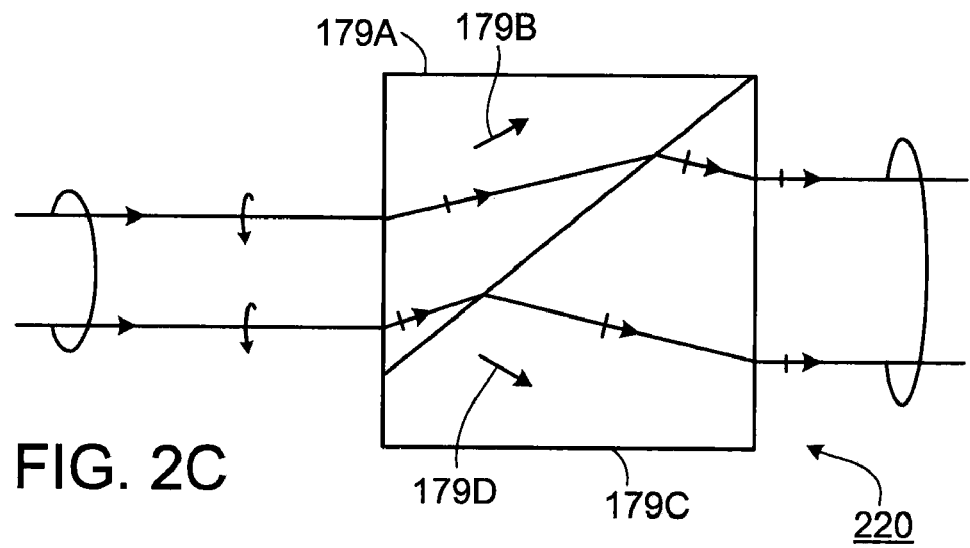

An example of a birefringent anamorphic afocal attachment shown in FIG. 2c. Anamorphic afocal attachment 220 includes two birefringent prisms 179A and 179C bonded together. FIG. 2c illustrates the operation of the birefringent anamorphic afocal attachment in a magnifying mode (i.e., the beam exiting the attachment propagating from left to right is magnified relative to the beam that enters the attachment). The bireftingent prisms may include, for example, uniaxial crystals such as calcite and paratellurite. The optic axes for birefringent prisms 179A and 179C are shown in FIG. 2c as elements 179B and 179D, respectively. Polarization of the input beam is extraordinary. The path of the input beam through the birefringent anamorphic afocal attachment and the directions for the optic axes 179B and 179D are shown for a system including positive uniaxial crystals wherein the ordinary index of refraction is less than the extraordinary index of refraction.

While FIG. 1 shows the use of an afocal system with an HSPMI, afocal systems can also be used to reduce beam shear and associated errors in systems that use other types of interferometer.

For example, afocal systems can be used in dispersion measuring applications. In dispersion measuring applications effects of non-cyclic non-linear errors may be amplified by one or more orders of magnitude. In a dispersion measuring application, optical path length measurements are made at multiple wavelengths, e.g., 532 nm and 1064 nm, and are used to measure dispersion of a gas in the measurement path of the distance measuring interferometer. The dispersion measurement can be used to convert the optical path length measured by a distance measuring interferometer into a physical length. Such a conversion can be important since changes in the measured optical path length can be caused by gas turbulence and/or by a change in the average density of the gas in the measurement arm even though the physical distance to the measurement object is unchanged.

In addition to the extrinsic dispersion measurement, the conversion of the optical path length to a physical length requires knowledge of an intrinsic value of the gas. The factor $\Gamma$ is a suitable intrinsic value and is the reciprocal dispersive power of the gas for the wavelengths used in the dispersion interferometry. Values for $\Gamma$ range for example from approximately 20 to 100 depending on the wavelengths used in the dispersion measurements. The effects of non-cyclic non-linear errors in the extrinsic dispersion measurement are multiplied by the factor of $\Gamma$ in the conversion of the optical path length to a physical length.

The factor $\Gamma$ can be measured separately or based on literature values. Non-cyclic non-linearities in the interferometer also contribute to measurements of the factor $\Gamma$. In addition, non-cyclic non-linearities can degrade interferometric measurements used to measure and/or monitor the wavelength of a beam.

Furthermore, afocal systems can be used in other forms of interferometers, such as the interferometers described in commonly owned U.S. patent application Ser. No. 10/227, 167 (Z-345) entitled "Zero Shear Plane Mirror Interferometer," and in U.S. patent application Ser. No. 10/227,166 (Z-346) entitled "Zero Shear Non-Plane Mirror Interferometers," in an article entitled "Differential interferometer arrangements for distance and angle measurements: Principles, advantages and applications" by C. Zanoni, *VDI Berichte Nr.* 749, 93-106 (1989). The two cited U.S. patent applications are by Henry A. Hill. The contents of the two cited U.S. patent applications and the cited article by Zanoni are herewithin incorporated in their entirety by reference.

The interferometry systems described herein provide highly accurate measurements. Such systems can be especially useful in lithography applications used in fabricating large scale integrated circuits such as computer chips and the like. Lithography is the key technology driver for the semiconductor manufacturing industry. Overlay improvement is one of the five most difficult challenges down to and below 100 nm line widths (design rules), see, for example, the *Semiconductor Industry Roadmap*, p. 82 (1997).

Overlay depends directly on the performance, i.e., accuracy and precision, of the distance measuring interferometers used to position the wafer and reticle (or mask) stages. Since a lithography tool may produce $50-100M/year of product, the economic value from improved performance distance measuring interferometers is substantial. Each 1% increase in yield of the lithography tool results in approximately $1M/year economic benefit to the integrated circuit manufacturer and substantial competitive advantage to the lithography tool vendor.

The function of a lithography tool is to direct spatially patterned radiation onto a photoresist-coated wafer. The process involves determining which location of the wafer is to receive the radiation (alignment) and applying the radiation to the photoresist at that location (exposure).

To properly position the wafer, the wafer includes alignment marks on the wafer that can be measured by dedicated sensors. The measured positions of the alignment marks define the location of the wafer within the tool. This information, along with a specification of the desired patterning of the wafer surface, guides the alignment of the wafer relative to the spatially patterned radiation. Based on such information, a translatable stage supporting the photoresist-coated wafer moves the wafer such that the radiation will expose the correct location of the wafer.

During exposure, a radiation source illuminates a patterned reticle, which scatters the radiation to produce the spatially patterned radiation. The reticle is also referred to as a mask, and these terms are used interchangeably below. In the case of reduction lithography, a reduction lens collects the scattered radiation and forms a reduced image of the reticle pattern. Alternatively, in the case of proximity printing, the scattered radiation propagates a small distance (typically on the order of microns) before contacting the wafer to produce a 1:1 image of the reticle pattern. The radiation initiates photochemical processes in the resist that convert the radiation pattern into a latent image within the resist.

Interferometry systems are important components of the positioning mechanisms that control the position of the wafer and reticle, and register the reticle image on the wafer. If such interferometry systems include the features described above, the accuracy of distances measured by the systems increases as cyclic error contributions to the distance measurement are minimized.

In general, the lithography system, also referred to as an exposure system, typically includes an illumination system and a wafer positioning system. The illumination system includes a radiation source for providing radiation such as ultraviolet, visible, x-ray, electron, or ion radiation, and a reticle or mask for imparting the pattern to the radiation, thereby generating the spatially patterned radiation. In addition, for the case of reduction lithography, the illumination system can include a lens assembly for imaging the spatially patterned radiation onto the wafer. The imaged radiation exposes resist coated onto the wafer. The illumination system also includes a mask stage for supporting the mask and a positioning system for adjusting the position of the mask stage relative to the radiation directed through the mask. The wafer positioning system includes a wafer stage for supporting the wafer and a positioning system for adjusting the position of the wafer stage relative to the imaged radiation. Fabrication of integrated circuits can include multiple exposing steps. For a general reference on lithography, see, for example, J. R. Sheats and B. W. Smith, in *Microlithography: Science and Technology* (Marcel Dekker, Inc., New York, 1998), the contents of which is incorporated herein by reference.

Interferometry systems described above can be used to precisely measure the positions of each of the wafer stage and mask stage relative to other components of the exposure system, such as the lens assembly, radiation source, or support structure. In such cases, the interferometry system can be attached to a stationary structure and the measurement object attached to a movable element such as one of the mask and wafer stages. Alternatively, the situation can be reversed, with the interferometry system attached to a movable object and the measurement object attached to a stationary object.

More generally, such interferometry systems can be used to measure the position of any one component of the exposure system relative to any other component of the exposure system, in which the interferometry system is attached to, or supported by, one of the components and the measurement object is attached, or is supported by the other of the components.

Figure 3:
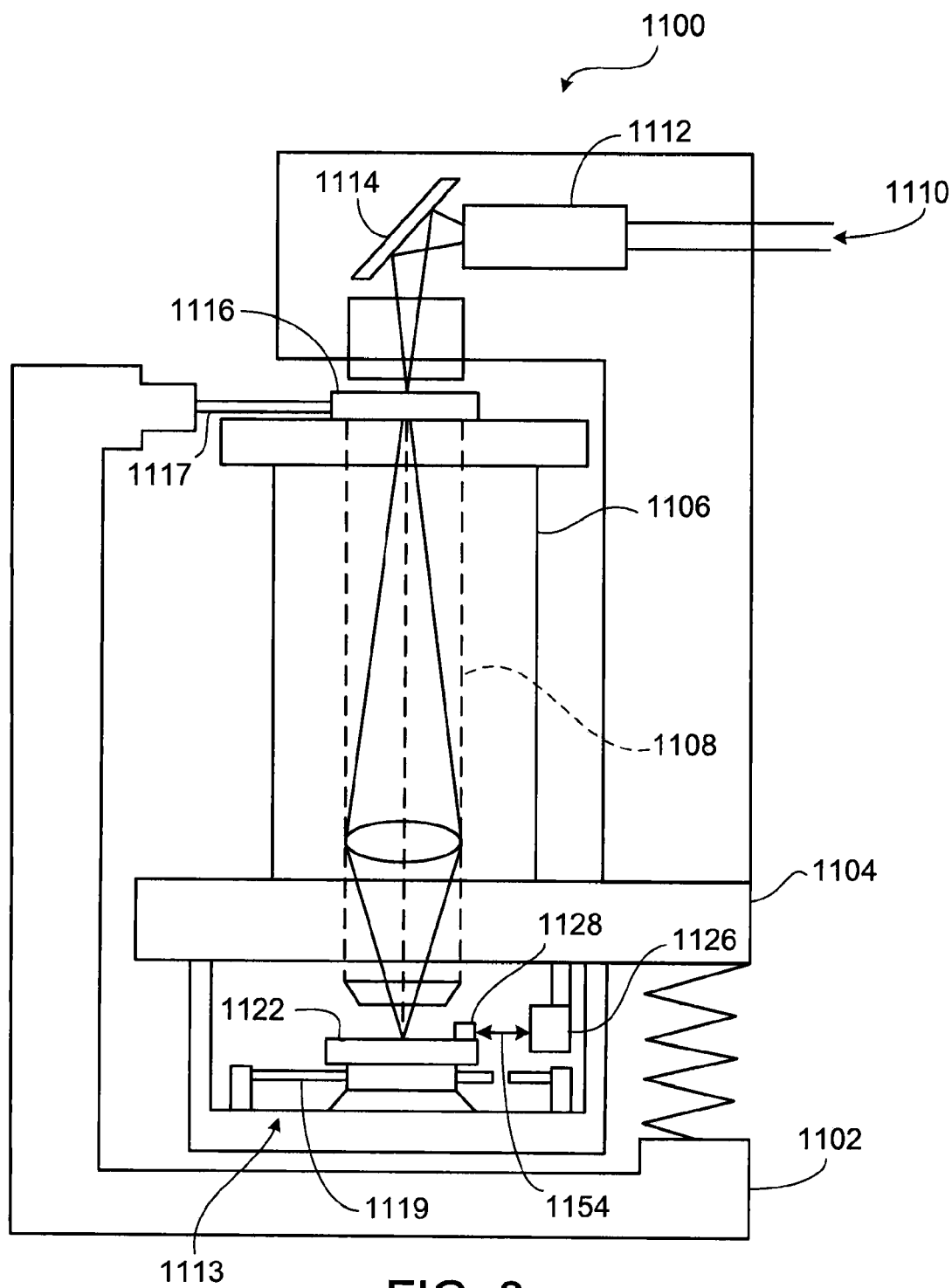
FIG. 3 is a schematic diagram of an embodiment of a lithography tool that includes an interferometer.

An example of a lithography scanner 1100 using an interferometry system 1126 is shown in FIG. 3. The interferometry system is used to precisely measure the position of a wafer (not shown) within an exposure system. Here, stage 1122 is used to position and support the wafer relative to an exposure station. Scanner 1100 includes a frame 1102, which carries other support structures and various components carried on those structures. An exposure base 1104 has mounted on top of it a lens housing 1106 atop of which is mounted a reticle or mask stage 1116, which is used to support a reticle or mask. A positioning system for positioning the mask relative to the exposure station is indicated schematically by element 1117. Positioning system 1117 can include, e.g., piezoelectric transducer elements and corresponding control electronics. Although, it is not included in this described embodiment, one or more of the interferometry systems described above can also be used to precisely measure the position of the mask stage as well as other moveable elements whose position must be accurately monitored in processes for fabricating lithographic structures (see supra Sheats and Smith *Microlithography: Science and Technology*).

Suspended below exposure base 1104 is a support base 1113 that carries wafer stage 1122. Stage 1122 includes a plane mirror 1128 for reflecting a measurement beam 1154 directed to the stage by interferometry system 1126. A positioning system for positioning stage 1122 relative to interferometry system 1126 is indicated schematically by element 1119. Positioning system 1119 can include, e.g., piezoelectric transducer elements and corresponding control electronics. The measurement beam reflects back to the interferometry system, which is mounted on exposure base 1104. The interferometry system can be any of the embodiments described previously.

During operation, a radiation beam 1110, e.g., an ultraviolet (UV) beam from a UV laser (not shown), passes through a beam shaping optics assembly 1112 and travels downward after reflecting from mirror 1114. Thereafter, the radiation beam passes through a mask (not shown) carried by mask stage 1116. The mask (not shown) is imaged onto a wafer (not shown) on wafer stage 1122 via a lens assembly 1108 carried in a lens housing 1106. Base 1104 and the various components supported by it are isolated from environmental vibrations by a damping system depicted by spring 1120.

In other embodiments of the lithographic scanner, one or more of the interferometry systems described previously can be used to measure distance along multiple axes and angles associated for example with, but not limited to, the wafer and reticle (or mask) stages. Also, rather than a UV laser beam, other beams can be used to expose the wafer including, e.g., x-ray beams, electron beams, ion beams, and visible optical beams.

In some embodiments, the lithographic scanner can include what is known in the art as a column reference. In such embodiments, the interferometry system 1126 directs the reference beam (not shown) along an external reference path that contacts a reference mirror (not shown) mounted on some structure that directs the radiation beam, e.g., lens housing 1106. The reference mirror reflects the reference beam back to the interferometry system. The interference signal produce by interferometry system 1126 when combining measurement beam 1154 reflected from stage 1122 and the reference beam reflected from a reference mirror mounted on the lens housing 1106 indicates changes in the position of the stage relative to the radiation beam. Furthermore, in other embodiments the interferometry system 1126 can be positioned to measure changes in the position of reticle (or mask) stage 1116 or other movable components of the scanner system. Finally, the interferometry systems can be used in a similar fashion with lithography systems involving steppers, in addition to, or rather than, scanners.

Figure 4A:
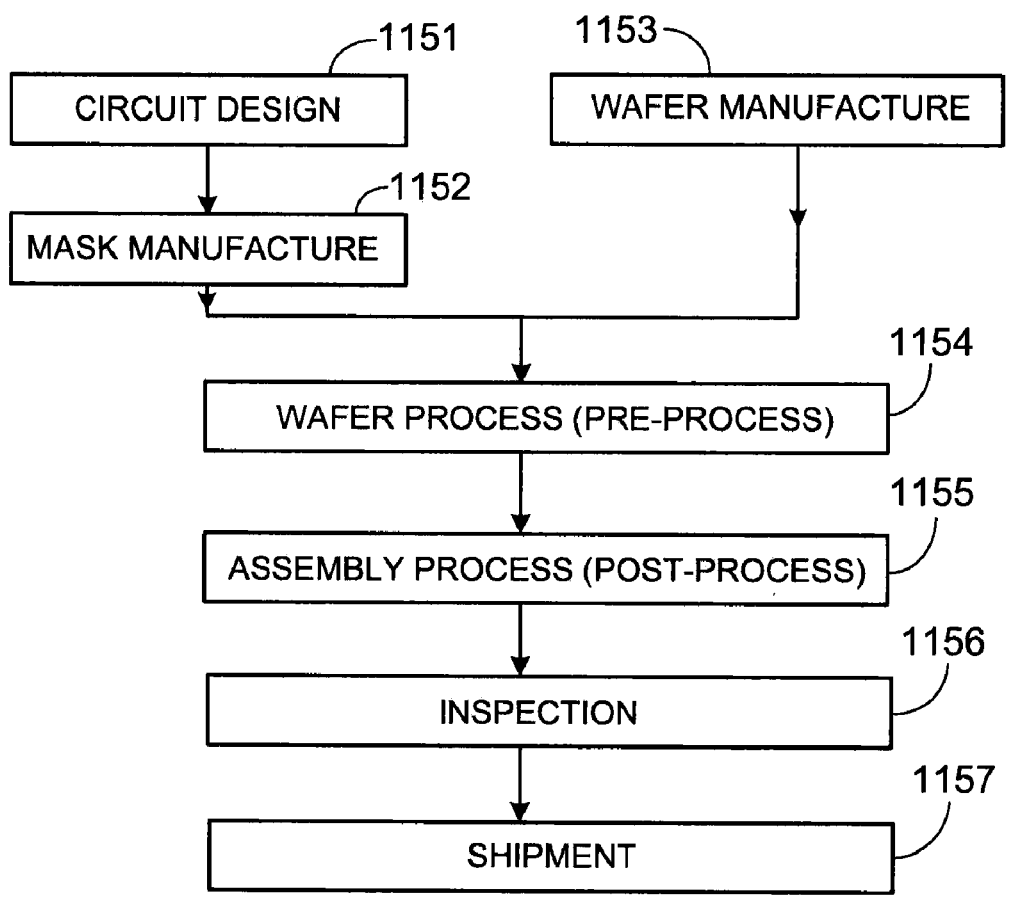
FIG. 4(*a*) and FIG. 4(*b*) are flow charts that describe steps for making integrated circuits.

As is well known in the art, lithography is a critical part of manufacturing methods for making semiconducting devices. For example, U.S. Pat. No. 5,483,343 outlines steps for such manufacturing methods. These steps are described below with reference to FIGS. 4*a* and 4*b*. FIG. 4*a* is a flow chart of the sequence of manufacturing a semiconductor device such as a semiconductor chip (e.g., IC or LSI), a liquid crystal panel or a CCD. Step 1151 is a design process for designing the circuit of a semiconductor device. Step 1152 is a process for manufacturing a mask on the basis of the circuit pattern design. Step 1153 is a process for manufacturing a wafer by using a material such as silicon.

Step 1154 is a wafer process which is called a pre-process wherein, by using the so prepared mask and wafer, circuits are formed on the wafer through lithography. To form circuits on the wafer that correspond with sufficient spatial resolution those patterns on the mask, interferometric positioning of the lithography tool relative the wafer is necessary. The interferometry methods and systems described herein can be especially useful to improve the effectiveness of the lithography used in the wafer process.

Step 1155 is an assembling step, which is called a post-process wherein the wafer processed by step 1154 is formed into semiconductor chips. This step includes assembling (dicing and bonding) and packaging (chip sealing). Step 1156 is an inspection step wherein operability check, durability check and so on of the semiconductor devices produced by step 1155 are carried out. With these processes, semiconductor devices are finished and they are shipped (step 1157).

Figure 4B:
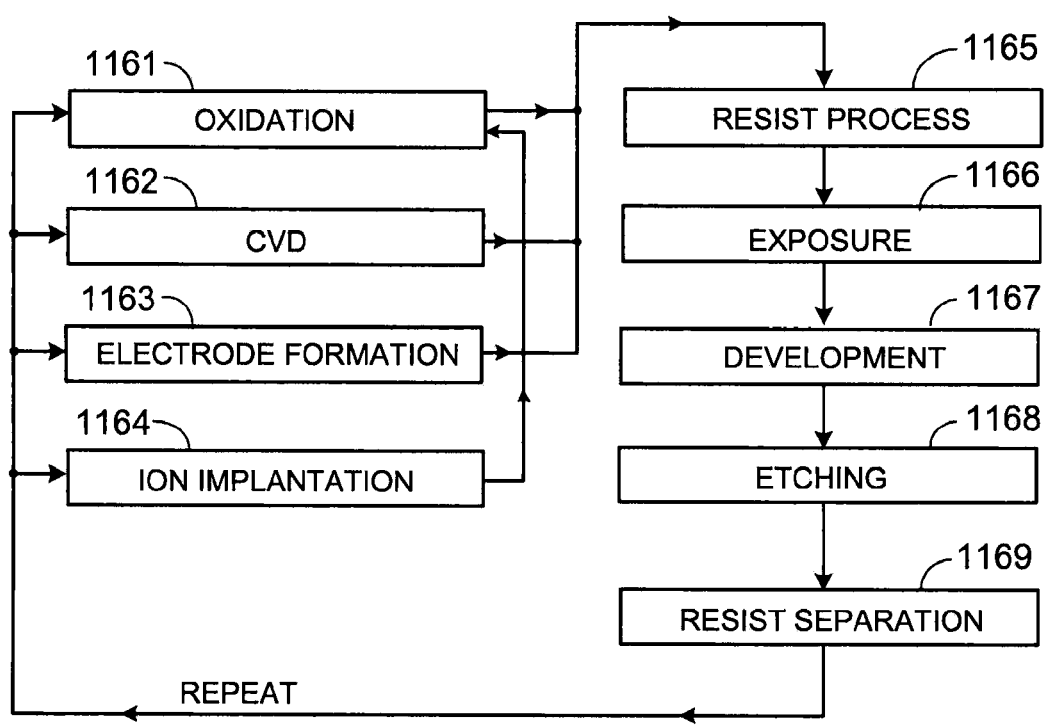

FIG. 4*b* is a flow chart showing details of the wafer process. Step 1161 is an oxidation process for oxidizing the surface of a wafer. Step 1162 is a CVD process for forming an insulating film on the wafer surface. Step 1163 is an electrode forming process for forming electrodes on the wafer by vapor deposition. Step 1164 is an ion implanting process for implanting ions to the wafer. Step 1165 is a resist process for applying a resist (photosensitive material) to the wafer. Step 1166 is an exposure process for printing, by exposure (i.e., lithography), the circuit pattern of the mask on the wafer through the exposure apparatus described above. Once again, as described above, the use of the interferometry systems and methods described herein improve the accuracy and resolution of such lithography steps.

Step 1167 is a developing process for developing the exposed wafer. Step 1168 is an etching process for removing portions other than the developed resist image. Step 1169 is a resist separation process for separating the resist material remaining on the wafer after being subjected to the etching process. By repeating these processes, circuit patterns are formed and superimposed on the wafer.

The interferometry systems described above can also be used in other applications in which the relative position of an object needs to be measured precisely. For example, in applications in which a write beam such as a laser, x-ray, ion, or electron beam, marks a pattern onto a substrate as either the substrate or beam moves, the interferometry systems can be used to measure the relative movement between the substrate and write beam.

Figure 5:
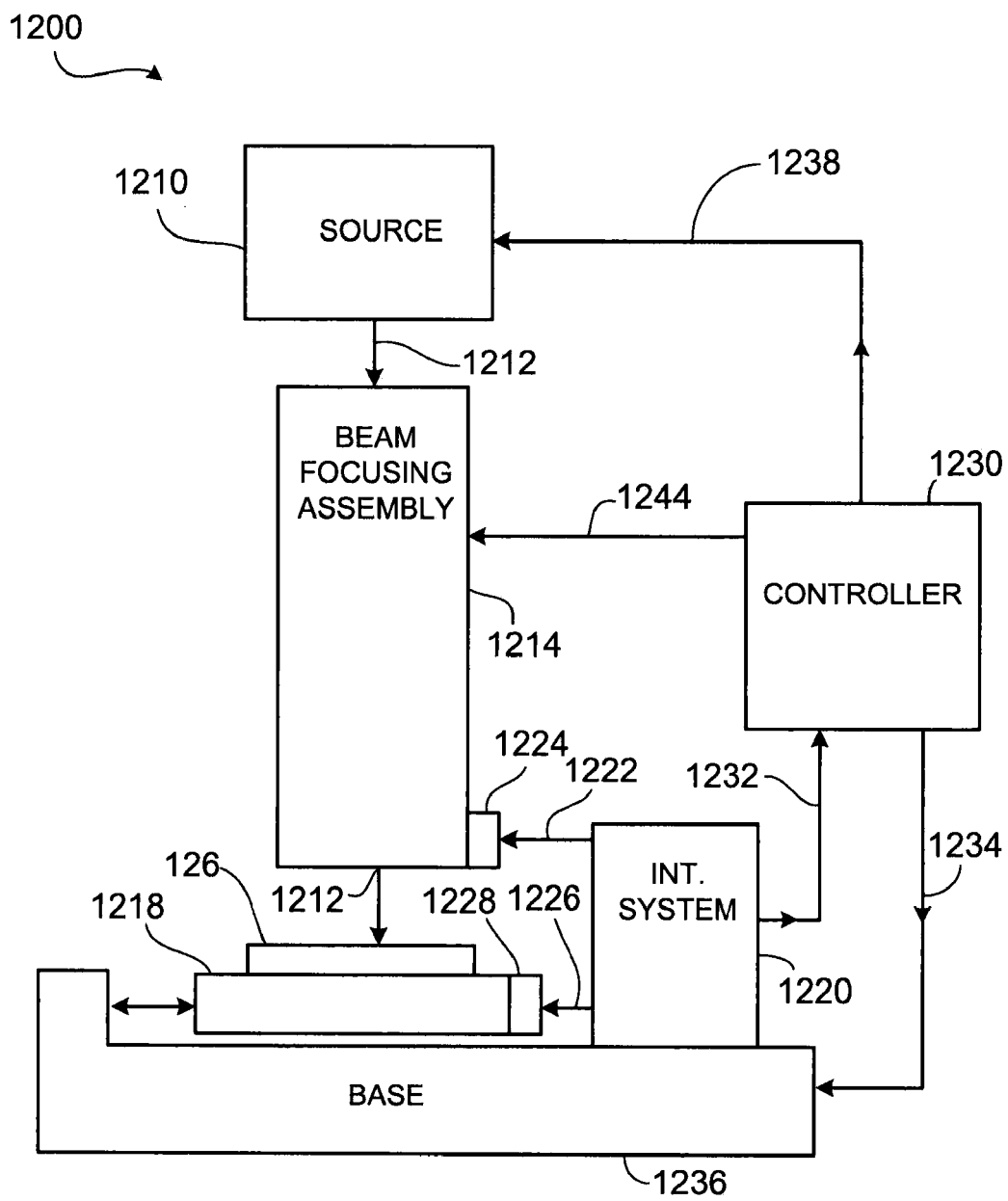
FIG. 5 is a schematic of a beam writing system that includes an interferometry system.

As an example, a schematic of a beam writing system 1200 is shown in FIG. 5. A source 1210 generates a write beam 1212, and a beam focusing assembly 1214 directs the radiation beam to a substrate 126 supported by a movable stage 1218. To determine the relative position of the stage, an interferometry system 1220 directs a reference beam 1222 to a mirror 1224 mounted on beam focusing assembly 1214 and a measurement beam 1226 to a mirror 1228 mounted on stage 1218. Since the reference beam contacts a mirror mounted on the beam focusing assembly, the beam writing system is an example of a system that uses a column reference. Interferometry system 1220 can be any of the interferometry systems described previously. Changes in the position measured by the interferometry system correspond to changes in the relative position of write beam 1212 on substrate 126. Interferometry system 1220 sends a measurement signal 1232 to controller 1230 that is indicative of the relative position of write beam 1212 on substrate 126. Controller 1230 sends an output signal 1234 to a base 1236 that supports and positions stage 1218. In addition, controller 1230 sends a signal 1238 to source 1210 to vary the intensity of, or block, write beam 1212 so that the write beam contacts the substrate with an intensity sufficient to cause photophysical or photochemical change only at selected positions of the substrate.

Furthermore, in some embodiments, controller 1230 can cause beam focusing assembly 1214 to scan the write beam over a region of the substrate, e.g., using signal 1244. As a result, controller 1230 directs the other components of the system to pattern the substrate. The patterning is typically based on an electronic design pattern stored in the controller. In some applications the write beam patterns a resist coated on the substrate and in other applications the write beam directly patterns, e.g., etches, the substrate.

An important application of such a system is the fabrication of masks and reticles used in the lithography methods described previously. For example, to fabricate a lithography mask an electron beam can be used to pattern a chromium-coated glass substrate. In such cases where the write beam is an electron beam, the beam writing system encloses the electron beam path in a vacuum. Also, in cases where the write beam is, e.g., an electron or ion beam, the beam focusing assembly includes electric field generators such as quadrapole lenses for focusing and directing the charged particles onto the substrate under vacuum. In other cases where the write beam is a radiation beam, e.g., x-ray, UV, or visible radiation, the beam focusing assembly includes corresponding optics and for focusing and directing the radiation to the substrate.

A number of embodiments of the invention have been described. Nevertheless, it will be understood that various modifications may be made without departing from the spirit and scope of the invention.

What is claimed is:

1. An interferometry system, comprising:
   an interferometer configured to direct a first beam and a second beam derived from common light source along different paths and to combine the two beams to form an output beam having a phase related to an optical path difference between the different paths, wherein the path of the first beam contacts a measurement object; and
   an assembly positioned in the path of the first beam and configured to reduce a shear of the first beam caused by a variation in the orientation of the measurement object relative to the interferometer as it propagates within the interferometer after contacting the measurement object, wherein the assembly is positioned in the path of the first beam before the first beam contacts the measurement object.

2. The interferometry system of claim 1, wherein the assembly comprises an afocal system.

3. The interferometry system of claim 1, wherein the assembly changes a dimension of the first beam relative to the first beam's dimension as it exits the interferometer.

4. The interferometry system of claim 1, wherein the assembly changes the diameter of the first beam relative to the first beam's diameter as it exits the interferometer.

5. The interferometry system of claim 1, further comprising a detector configured to monitor the intensity of a component of the output beam.

6. The interferometry system of claim 1, further comprising an electronic controller configured so that during operation of the interferometry system the electronic controller monitors variations in the position of the measurement object relative to the interferometer based on the phase of the output beam.

7. The interferometry system of claim 6, wherein the reduction in shear of the first beam due to the assembly reduces related non-cyclic non-linear errors associated with the phase of the output beam.

8. The interferometry system of claim 1, wherein the path of the first beam contacts the measurement object more than once.

9. The interferometry system of claim 1, wherein the assembly is positioned in the path of the first beam for each pass of the first beam to the measurement object.

10. The interferometry system of claim 1, wherein the interferometer is a high stability plane mirror interferometer.

11. The interferometry system of claim 1, wherein the measurement object comprises a plane mirror.

12. A lithography system for use in fabricating integrated circuits on a wafer, the system comprising:
   a stage for supporting the wafer;
   an illumination system for imaging spatially patterned radiation onto the wafer;
   a positioning system for adjusting the position of the stage relative to the imaged radiation; and
   the interferometry system of claim 1 for monitoring the position of the wafer relative to the imaged radiation.

13. A method for fabricating integrated circuits, the method comprising:
   applying a resist to a wafer;
   forming a pattern of a mask in the resist by exposing the wafer to radiation using the lithography system of claim 12; and
   producing an integrated circuit from the wafer.

14. A lithography system for use in fabricating integrated circuits on a wafer, the system comprising:
   a stage for supporting the wafer; and
   an illumination system including a radiation source, a mask, a positioning system, a lens assembly, and the interferometry system of claim 1,
   wherein during operation the source directs radiation through the mask to produce spatially patterned radiation, the positioning system adjusts the position of the mask relative to the radiation from the source, the lens assembly images the spatially patterned radiation onto the wafer, and the multi-axis interferometry system monitors the position of the mask relative to the radiation from the source.

15. A method for fabricating integrated circuits, the method comprising:
   applying a resist to a wafer;
   forming a pattern of a mask in the resist by exposing the wafer to radiation using the lithography system of claim 14; and
   producing an integrated circuit from the wafer.

16. A beam writing system for use in fabricating a lithography mask, the system comprising:
   a source providing a write beam to pattern a substrate;
   a stage supporting the substrate;
   a beam directing assembly for delivering the write beam to the substrate;
   a positioning system for positioning the stage and beam directing assembly relative one another; and
   the interferometry system of claim 1 for monitoring the position of the stage relative to the beam directing assembly.

17. A lithography method for use in fabricating integrated circuits on a wafer, the method comprising:
   supporting the wafer on a moveable stage;
   imaging spatially patterned radiation onto the wafer;
   adjusting the position of the stage; and
   monitoring the position of the stage using the interferometry system of claim 1.

18. A method for fabricating integrated circuits, the method comprising:
   applying a resist to a wafer;
   forming a pattern of a mask in the resist by exposing the wafer to radiation using the lithography method of claim 17; and
   producing an integrated circuit from the wafer.

19. A lithography method for use in the fabrication of integrated circuits comprising:
   directing input radiation through a mask to produce spatially patterned radiation;
   positioning the mask relative to the input radiation;
   monitoring the position of the mask relative to the input radiation using the interferometry system of claim 1; and
   imaging the spatially patterned radiation onto a wafer.

20. A method for fabricating integrated circuits, the method comprising:
   applying a resist to a wafer;
   forming a pattern of a mask in the resist by exposing the wafer to radiation using the lithography method of claim 19; and
   producing an integrated circuit from the wafer.

21. A lithography method for fabricating integrated circuits on a wafer comprising:
   positioning a first component of a lithography system relative to a second component of a lithography system to expose the wafer to spatially patterned radiation; and
   monitoring the position of the first component relative to the second component using the interferometry system of claim 1.

22. A method for fabricating integrated circuits, the method comprising:
   applying a resist to a wafer;
   forming a pattern of a mask in the resist by exposing the wafer to radiation using the lithography method of claim 21; and
   producing an integrated circuit from the wafer.

23. A method for fabricating a lithography mask, the method comprising:
   directing a write beam to a substrate to pattern the substrate;
   positioning the substrate relative to the write beam; and
   monitoring the position of the substrate relative to the write beam using the interferometry system of claim 1.

24. An interferometry system, comprising:
   an interferometer configured to direct a first beam and a second beam derived from common light source along different paths and to combine the two beams to form an output beam including information related to an optical path difference between the different paths, wherein the path of the first beam contacts a measurement object; and
   an afocal system positioned in the path of the first beam and configured to increase a dimension of the first beam as it propagates from the interferometer towards the measurement object and reduces the dimension of the first beam as it returns from the measurement object propagating towards the interferometer,
   wherein the afocal system is positioned in the path of the first beam before the first beam contacts the measurement object.

25. The interferometry system of claim 24, wherein the afocal system reduces a contribution of wavefront errors to the information introduced to the first beam by the interferometer after the first beam contacts from the measurement object.

26. The interferometry system of claim 24, wherein the path of the first beam contacts the measurement object more than once.

27. The interferometry system of claim 26, further comprising a second afocal system positioned in the path of the first beam along which the first beam propagates as it makes a second pass to the measurement object.

28. The interferometry system of claim 27, wherein the second afocal system is configured to increase the dimension of the first beam as it propagates from the interferometer towards the measurement object for the second time and reduces the dimension of the first beam as it returns from the measurement object propagating towards the interferometer.

29. The interferometry system of claim 28, wherein the afocal systems reduce the dimension of the first beam by substantially the same amount.

30. The interferometry system of claim 24, wherein the dimension is the beam radius along one axis.

31. The interferometry system of claim 24, wherein the dimension is the beam radius along two orthogonal axes.

32. An interferometry system, comprising:
   an interferometer configured to direct a first beam and a second beam derived from common light source along different paths and to combine the two beams to form an output beam having a phase related to an optical path difference between the different paths, wherein the path of the first beam contacts a measurement object; and
   an afocal system positioned in the path of the first beam between the interferometer and the measurement object and configured to change a diameter of the first beam relative to the first beam's diameter as it exits the interferometer propagating towards the measurement object,
   wherein the afocal system is positioned in the path of the first beam before the first beam contacts the measurement object.

* * * * *